US012695431B2

(12) United States Patent
Andrys

(10) Patent No.:  US 12,695,431 B2
(45) Date of Patent:      Jul. 28, 2026

(54) CIRCUITS, DEVICES AND METHODS RELATED TO PROTECTION OF RADIO-FREQUENCY AMPLIFIERS

(71) Applicant: SKYWORKS SOLUTIONS, INC., Irvine, CA (US)

(72) Inventor: Paul Raymond Andrys, Swisher, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/425,636

(22) Filed: Jan. 29, 2024

(65) Prior Publication Data

US 2024/0250645 A1      Jul. 25, 2024

Related U.S. Application Data

(63) Continuation of application No. 17/228,983, filed on Apr. 13, 2021, now Pat. No. 11,888,452.

(60) Provisional application No. 63/009,442, filed on Apr. 13, 2020.

(51) Int. Cl.

| | |
|---|---|
| *H03G 3/20* | (2006.01) |
| *H03F 1/02* | (2006.01) |
| *H03F 1/22* | (2006.01) |
| *H03F 1/52* | (2006.01) |
| *H03F 3/195* | (2006.01) |
| *H03F 3/24* | (2006.01) |
| *H03F 3/72* | (2006.01) |

(52) U.S. Cl.
CPC ........... *H03F 1/523* (2013.01); *H03F 1/0222* (2013.01); *H03F 1/223* (2013.01); *H03F 3/195* (2013.01); *H03F 3/245* (2013.01);

*H03F 3/72* (2013.01); *H03F 2200/294* (2013.01); *H03F 2200/435* (2013.01); *H03F 2200/451* (2013.01)

(58) Field of Classification Search
CPC ....................................................... H03G 3/20
USPC ......................................... 330/129, 136, 311
See application file for complete search history.

(56) References Cited

U.S. PATENT DOCUMENTS

| | | | |
|---|---|---|---|
| 7,164,321 B2 * | 1/2007 | Behzad ................. | H03F 1/0261 330/311 |
| 7,493,091 B2 * | 2/2009 | Matsuura ............. | H03G 3/3047 455/114.2 |
| 8,093,948 B2 * | 1/2012 | Kim ...................... | H03F 1/0266 330/136 |
| 8,665,027 B2 * | 3/2014 | Pai ........................ | H03F 1/3205 330/285 |
| 9,287,829 B2 * | 3/2016 | Nobbe .................... | H03F 3/195 |
| 10,469,112 B2 * | 11/2019 | Coban .................... | H03F 3/195 |
| 2005/0077963 A1 | 4/2005 | Behzad | |
| 2018/0026592 A1 | 1/2018 | Wallis | |

(Continued)

*Primary Examiner* — Henry Choe
(74) *Attorney, Agent, or Firm* — Chang & Hale LLP

(57) ABSTRACT

In some embodiments, a method for operating a radio-frequency amplifier can include providing a bias signal to an amplifier implemented between an input node and an output node, and generating a detected voltage representative of a peak of a radio-frequency signal present at the input node. The method can further include enabling a protection mode when the detected voltage is greater than a first threshold value and disabling the protection mode when the detected voltage is less than a second threshold value that is less than the first threshold value.

2 Claims, 11 Drawing Sheets

(56) References Cited

U.S. PATENT DOCUMENTS

| | | | |
|---|---|---|---|
| 2018/0351592 A1 | 12/2018 | Coban | |
| 2024/0250645 A1* | 7/2024 | Andrys | .................. H03F 3/245 |

* cited by examiner

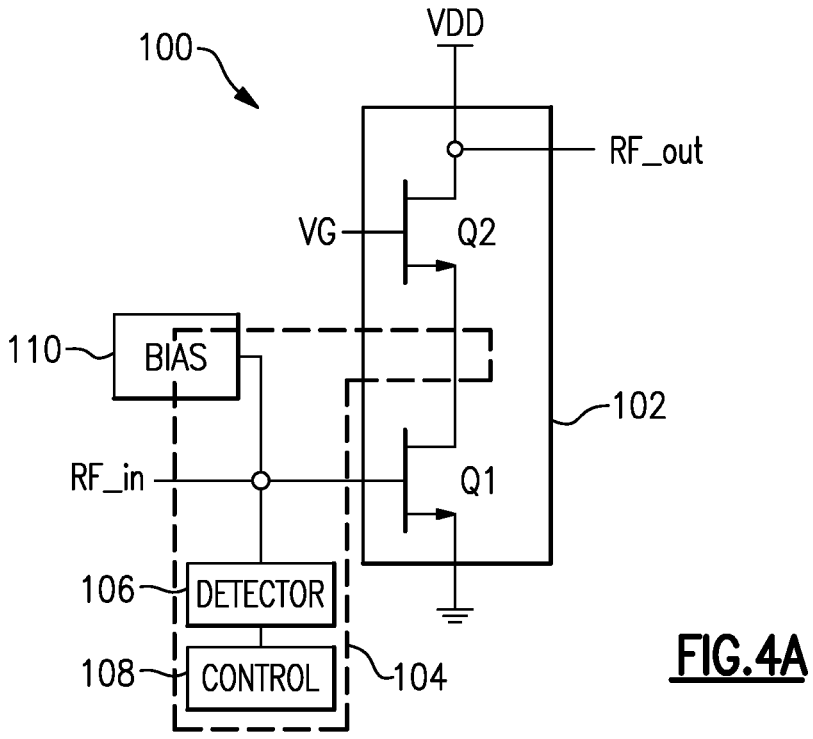
_FIG.4A_
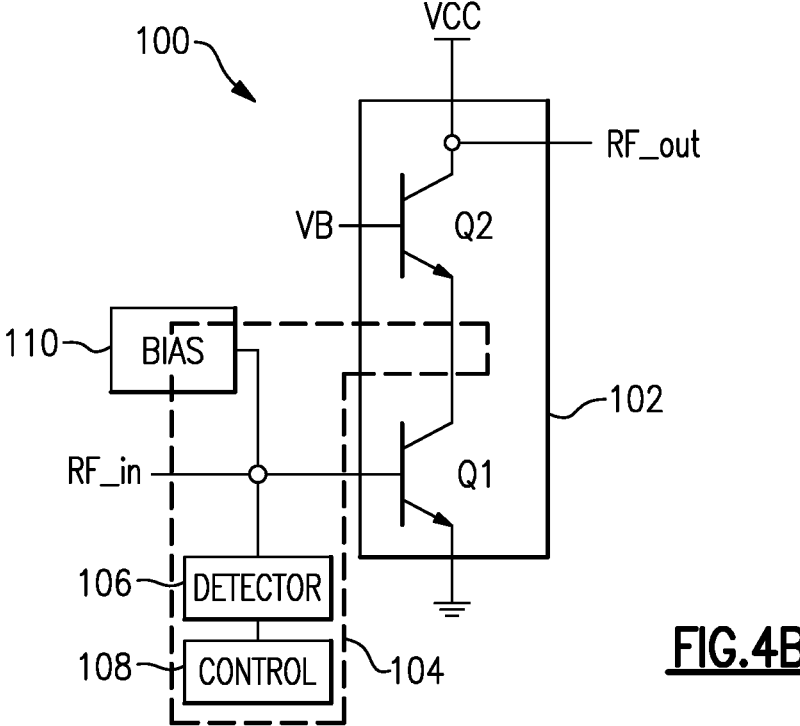
_FIG.4B_

200    202

204    100    DIE

AMPLIFIER
CIRCUIT

204

302    300

MODULE

200

308    DIE

100

AMPLIFIER
CIRCUIT

310

304

SMD

314

WIRELESS DEVICE ⎧─500

DIVERSITY ANTENNA(S)

502    508       512

300    DIVERSITY Rx    530

USER INTERFACE

BASEBAND SUB-SYSTEM

TRANSCEIVER

PA

ASM        514

532

520

MEMORY

MAIN ANTENNA 504    510

POWER MANAGEMENT

506

610    620

Rx
500

Tx
600

1

CIRCUITS, DEVICES AND METHODS RELATED TO PROTECTION OF RADIO-FREQUENCY AMPLIFIERS

CROSS-REFERENCE TO RELATED APPLICATION(S)

This application is a continuation of U.S. application Ser. No. 17/228,983 filed Apr. 13, 2021, entitled AMPLIFIER HAVING INPUT POWER PROTECTION, which claims priority to and the benefit of the filing date of U.S. Provisional Application No. 63/009,442 filed Apr. 13, 2020, entitled AMPLIFIER HAVING INPUT POWER PROTECTION, the benefits of the filing dates of which are hereby claimed and the disclosures of which are hereby expressly incorporated by reference herein in their entirety.

BACKGROUND

Field

The present disclosure relates to power protection for amplifiers.

Description of the Related Art

In electronics applications, an amplifier is utilized to amplify a signal such as a radio-frequency (RF) signal. Such an amplified signal can be further processed in, for example, a receiver circuit.

SUMMARY

In accordance with some implementations, the present disclosure relates to an amplifier circuit that includes an input node and an output node, and an amplifier implemented between the input node and the output node. The amplifier circuit further includes a bias circuit configured to provide a bias signal to the amplifier, and a protection circuit configured to generate a detected voltage representative of a peak of a radio-frequency signal present at the input node. The protection circuit is further configured to enable a protection mode when the detected voltage is greater than a first threshold value and to disable the protection mode when the detected voltage is less than a second threshold value that is less than the first threshold value.

In some embodiments, the input node can be configured to be coupled to an antenna. The amplifier can be a low-noise amplifier configured to support a receive operation.

In some embodiments, the amplifier can include a cascode arrangement of a first transistor and a second transistor, with the first transistor having an input coupled to the input node, and the second transistor being coupled to the first transistor and having an output coupled to the output node. Each of the first and second transistors can be a field-effect transistor having a gate, a drain and a source. The first transistor can be implemented as a common source device, and the second transistor can be implemented as a common gate device, such that the gate of the first transistor is coupled to the input node, the drain of the first transistor is coupled to the source of the second transistor, and the drain of the second transistor is coupled to the output node. The source of the first transistor can be coupled to ground, and the gate of the second transistor can be coupled to a node having a gate potential.

In some embodiments, the protection circuit can include an assembly switches configured to implement the enablement and disablement of the protection mode. The assembly of switches can include a shunt switch configured to allow switchable shunting of the radio-frequency signal from the input node to ground. The shunt switch can be configured to be open when the protection circuit disables the protection mode, and to be closed when the protection circuit enables the protection mode.

In some embodiments, the assembly of switches can include an inter-transistor switch configured to provide a switchable coupling of the first and second transistors. The inter-transistor switch can be configured to be closed when the protection circuit disables the protection mode to allow a partially amplified signal from the first transistor to be provided as an input for the second transistor, and to be open when the protection circuit enables the protection mode to disconnect the second transistor from the first transistor.

In some embodiments, the bias circuit can be configured to provide the bias signal to the input of the first transistor through a bias resistance. The bias circuit can include a current mirror, such that the bias signal is representative of an output of the current mirror.

In some embodiments, the assembly of switches can include one or more switches implemented in the current mirror. The one or more switches of the current mirror can be configured to enable operation of the current mirror when the protection circuit disables the protection mode, and to disable operation of the current mirror when the protection circuit enables the protection mode.

In some embodiments, the assembly of switches can include a bias shunt switch implemented between ground and a node between the current mirror and the bias resistance. The bias shunt switch can be configured to be open when the protection circuit disables the protection mode, and to be closed when the protection circuit enables the protection mode.

In some embodiments, the assembly of switches can include a bypass switch implemented to be electrically parallel with the bias resistance. The bypass switch can be configured to be open when the protection circuit disables the protection mode, and to be closed when the protection circuit enables the protection mode.

In some embodiments, the protection circuit can include a detector coupled to the input node to allow sampling of the radio-frequency signal. The detector can be configured to generate the detected voltage based on the peak of the sampled radio-frequency signal. In some embodiments, the detector can include a diode configured to limit a current associated with the sampled radio-frequency signal in one direction, and a resistance-capacitance circuit configured to generate the detected voltage. The resistance-capacitance circuit can include a parallel arrangement of a resistance and a capacitance between an output of the diode and ground.

In some embodiments, the detector can include a comparator configured to generate an enable output to enable the protection mode when the detected voltage is greater than the first threshold value, and to generate a disable output to disable the protection mode when the detected voltage is less than the second threshold value. In some embodiments, the comparator can include a Schmitt trigger.

In some embodiments, the protection circuit can further include a control logic circuit configured to generate a first set of control signals to enable the protection mode based on the enable output of the comparator, and to generate a second set of control signals to disable the protection mode based on the disable output of the comparator. Each of the first and second sets of control signals can include switch control signals.

In some embodiments, the amplifier circuit can further include an electrostatic discharge circuit coupled to the input node and configured to provide a discharge path to ground when a voltage at the input node is greater than a discharge threshold value. The electrostatic discharge circuit can include a plurality of diodes each configured as multi-stack device having a reduced size to meet lower electrostatic discharge protection requirement, to thereby provide a reduced parasitic capacitance.

In some implementations, the present disclosure relates to a die that includes a semiconductor substrate and an amplifier circuit implemented on the semiconductor substrate. The amplifier circuit includes an input node and an output node, and an amplifier implemented between the input node and the output node. The amplifier circuit further includes a bias circuit configured to provide a bias signal to the amplifier. The amplifier circuit further includes a protection circuit configured to generate a detected voltage representative of a peak of a radio-frequency signal present at the input node. The protection circuit is further configured to enable a protection mode when the detected voltage is greater than a first threshold value and to disable the protection mode when the detected voltage is less than a second threshold value that is less than the first threshold value.

In some embodiments, the semiconductor substrate can be configured to support CMOS processes.

According to a number of implementations, the present disclosure relates to a packaged module that includes a packaging substrate configured to receive a plurality of components, and an amplifier circuit implemented on the packaging substrate. The amplifier circuit includes an input node and an output node, and an amplifier implemented between the input node and the output node. The amplifier circuit further includes a bias circuit configured to provide a bias signal to the amplifier. The amplifier circuit further includes a protection circuit configured to generate a detected voltage representative of a peak of a radio-frequency signal present at the input node. The protection circuit is further configured to enable a protection mode when the detected voltage is greater than a first threshold value and to disable the protection mode when the detected voltage is less than a second threshold value that is less than the first threshold value.

In some embodiments, substantially all of the amplifier circuit can be implemented on a semiconductor die that is mounted on the packaging substrate. In some embodiments, the amplifier circuit can be configured to support a receive operation. In some embodiments, the packaged module can be a receive module. In some embodiments, the receive module can be a diversity receive module.

In some teachings, the present disclosure relates to a wireless device that includes an antenna, a transceiver, and an amplifier circuit implemented between the antenna and the transceiver. The amplifier circuit includes an input node and an output node, and an amplifier implemented between the input node and the output node. The amplifier circuit further includes a bias circuit configured to provide a bias signal to the amplifier. The amplifier circuit further includes a protection circuit configured to generate a detected voltage representative of a peak of a radio-frequency signal present at the input node. The protection circuit is further configured to enable a protection mode when the detected voltage is greater than a first threshold value and to disable the protection mode when the detected voltage is less than a second threshold value that is less than the first threshold value.

In some embodiments, the input node of the amplifier circuit can be coupled to the antenna, and the output node of the amplifier circuit can be coupled to the transceiver. In some embodiments, the wireless device can be a cellular phone configured to operate in one or more cellular bands.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 4A shows that in some embodiments, an amplifier circuit can be implemented to include a protection circuit configured to detect, with a detector, a high electrical power condition along an input path to an amplifier.

FIG. 4B shows amplifier circuit having a similar architecture as the amplifier circuit of FIG. 4A, but where a cascode amplifier includes first and second bipolar junction transistors.

DETAILED DESCRIPTION OF SOME
EMBODIMENTS

The headings provided herein, if any, are for convenience only and do not necessarily affect the scope or meaning of the claimed invention.

Figure 1:
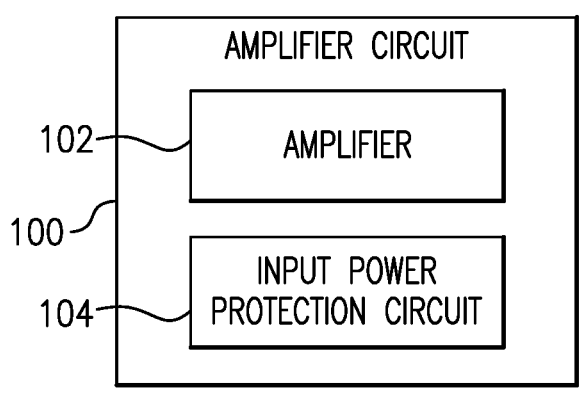
FIG. 1 depicts an amplifier circuit having an amplifier and an input power protection circuit.

FIG. 1 depicts an amplifier circuit 100 having an amplifier 102 and an input power protection circuit 104. Various features associated with such an amplifier circuit are described herein. While various examples are described herein in the context of protecting the amplifier circuit based on an input of the amplifier, it will be understood that one or more features of the present disclosure can also be implemented in other applications with respect to an amplifier, in non-amplifier applications, etc.

Figure 2:
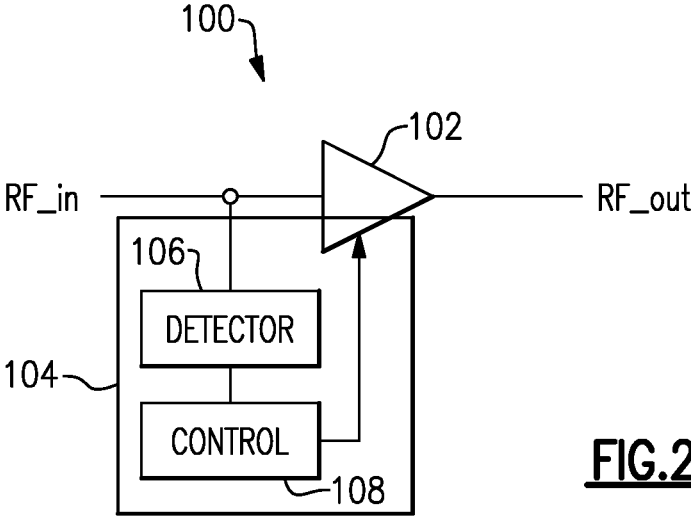
FIG. 2 shows an amplifier circuit that can be a more specific example of the amplifier circuit of FIG. 1.

FIG. 2 shows an amplifier circuit 100 that can be a more specific example of the amplifier circuit 100 of FIG. 1, in the context of providing circuit protection based on an input of an amplifier 102. Accordingly, such an amplifier circuit is shown to include an input power protection circuit 104 coupled to an input signal path. Such an input signal path is shown to allow a radio-frequency (RF) signal (RF_in) to be provided as an input for the amplifier 102 to thereby generate an amplified RF signal (RF_out).

FIG. 2 shows that in some embodiments, the input power protection circuit 104 can include a detector component 106 and a control component 108. For the purpose of description, it will be understood that a component can include one or more one or more devices, one or more circuits, or any combination thereof, implemented to provide a functionality. Accordingly, and as described herein, the detector component 106 can be configured to detect a condition associated with the input RF signal (RF_in) and generate an output representative of the condition. The control component 108 can be configured to generate one or more control signals based on the output of the detector component 106, and such control signal(s) can be utilized to configure the operation of the amplifier 102 so as to prevent or reduce the likelihood of damage that may arise from the condition associated with the input signal. More specific examples of such detection and control functionalities are described herein in greater detail It is noted that in an example wireless application such a cellular phone, a receiver circuit typically includes a low-noise amplifier (LNA) configured to amplify a weak signal received through an antenna and routed through a front-end antenna switch/filter network. Such an LNA is typically configured to provide high gain, low noise figure (NF), and other performance features such as a high input third order intercept (IIP3) (e.g., over frequencies from 600 MHz to 5000 MHZ).

To achieve these high performance characteristics, such an LNA can be fabricated utilizing, for example, a CMOS RFIC (complementary metal-oxide-semiconductor radio-frequency integrated circuit) process which utilizes narrow channel (e.g., <90 nm), thin gate oxide (e.g., <1.8 nm) NMOS (N-type MOS) devices for a common source input stage. Since the gate oxide is relatively thin, these devices can fail due to time-dependent dielectric breakdown (TDDB) which can occur if the device is operated close to or beyond a specified maximum lifetime gate voltage (e.g., ~1.5V).

It is also noted that a cellular phone receiver can be subjected to high power RF signal(s) (e.g., up to 23 dBm) when in close proximity to one or more other cellular handsets. Under such a condition, peak voltages as high as +/−3.6V can exist on the NMOS gate of the above-referenced LNA, severely degrading the lifetime of the corresponding device.

Figure 3:
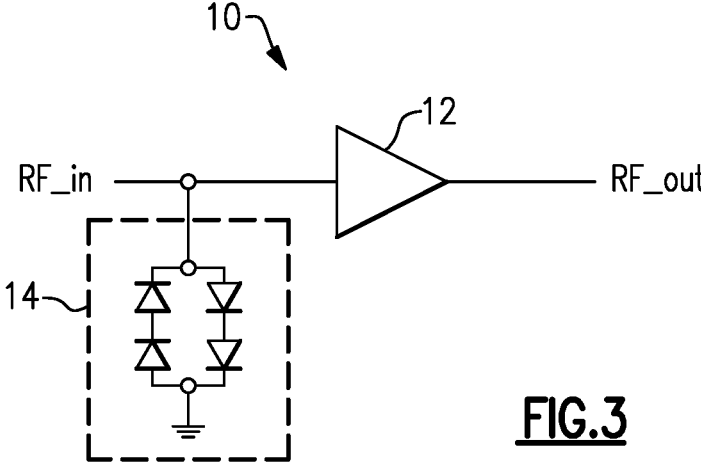
FIG. 3 shows an example amplifier circuit having a conventional protection circuit implemented as an electrostatic discharge (ESD) protection circuit coupled to an input path of an amplifier.

In many wireless designs, damage or permanent performance degradation that results from an electrical condition such as the foregoing high power voltage condition is not acceptable. Accordingly, some wireless designs include a protection circuit that provides limiting or clamping functionality at an input of an LNA. FIG. 3 shows an example amplifier circuit 10 having a conventional protection circuit implemented as an electro-static discharge (ESD) protection circuit 14 coupled to an input path of an LNA 12.

In the example of FIG. 3, the ESD protection circuit 14 is shown to include an anti-parallel combination of diodes that couples the input path of the LNA 12 and ground. Such a combination of diodes can be utilized to limit or clamp the input RF level to some safe level. To provide such protection functionality, single stack, large periphery diodes are typically required. However, such diodes typically load the input path with large parasitic capacitance that degrades the input impedance match to result in degradation in gain and noise figure performance. Such excessive diode parasitic capacitance can also become even more unmanageable as the operating frequency is increased.

In some embodiments, the amplifier circuit 100 of FIG. 2 can be configured such that the protection circuit 104 provides protection against high electrical power presented to the input of the amplifier 102 without the diode-based ESD protection circuit 14 of FIG. 3. For example, FIG. 4A shows that in some embodiments, an amplifier circuit 100 can be implemented to include a protection circuit 104 configured to detect, with a detector 106, a high electrical power condition along an input path to an amplifier 102. The protection circuit 104 is shown to further include a control component 106 configured to control operation of one or more parts of the amplifier circuit 100. Examples of such detector and control components are described herein in greater detail.

In the example of FIG. 4A, the amplifier 102 is configured as a cascode amplifier having a cascode arrangement of a first transistor Q1 and a second transistor Q2. For example, the first transistor Q1 can be implemented as a common source (CS) stage where an input signal (RF_in) is provided to a gate of Q1, and an amplified signal is output through a drain of Q1, with a source of Q1 being coupled to ground. The second transistor Q2 can be implemented as a common gate (CG) stage where the amplified signal from Q1 is provided to a source of Q2, and a further amplified signal is output through a drain of Q2, with a gate of Q2 being provided with a gate voltage VG.

In the example of FIG. 4A, the amplifier circuit 100 can further include a bias circuit 110 configured to provide, for example, a bias signal to the gate of Q1. Accordingly, such a bias circuit can be coupled to the input path that routes the input signal RF_in. In the example of FIG. 4A, the amplifier 102 is shown to be provided with a supply voltage VDD to the drain of the second transistor Q2.

In some embodiments, and as depicted in FIG. 4A, the protection circuit 104 can be configured such that the control component 108 controls operation of the input path, operation of the bias circuit, and/or operation of the cascode amplifier 102. Examples related to such protection operations are described herein in greater detail.

It is noted that the example of FIG. 4A and the more specific examples of FIGS. 5-8 are described in the context of a cascode amplifier utilizing field-effect transistors (FETs). It will be understood that in some embodiments, one or more features of the present disclosure can also be implemented for non-cascode configured amplifiers. It will also be understood that in some embodiments, one or more features of the present disclosure can also be implemented utilizing other types of transistors, including bipolar-junction transistors (BJTs).

For example, FIG. 4B shows amplifier circuit 100 having a similar architecture as the amplifier circuit 100 of FIG. 4A, but where a cascode amplifier 102 includes first and second BJTs Q1, Q2. More particularly, the first transistor Q1 can be implemented as a common emitter stage where an input signal (RF_in) is provided to a base of Q1, and an amplified signal is output through a collector of Q1, with an emitter of Q1 being coupled to ground. The second transistor Q2 can be implemented as a common base stage where the amplified signal from Q1 is provided to an emitter of Q2, and a further amplified signal is output through a collector of Q2, with a base of Q2 being provided with a base voltage VB.

In the example of FIG. 4B, the amplifier circuit 100 can further include a bias circuit 110 configured to provide, for example, a bias signal to the base of Q1. Accordingly, such a bias circuit can be coupled to the input path that routes the input signal RF_in. In the example of FIG. 4B, the amplifier 102 is shown to be provided with a supply voltage VCC to the collector of the second transistor Q2.

Figure 5:
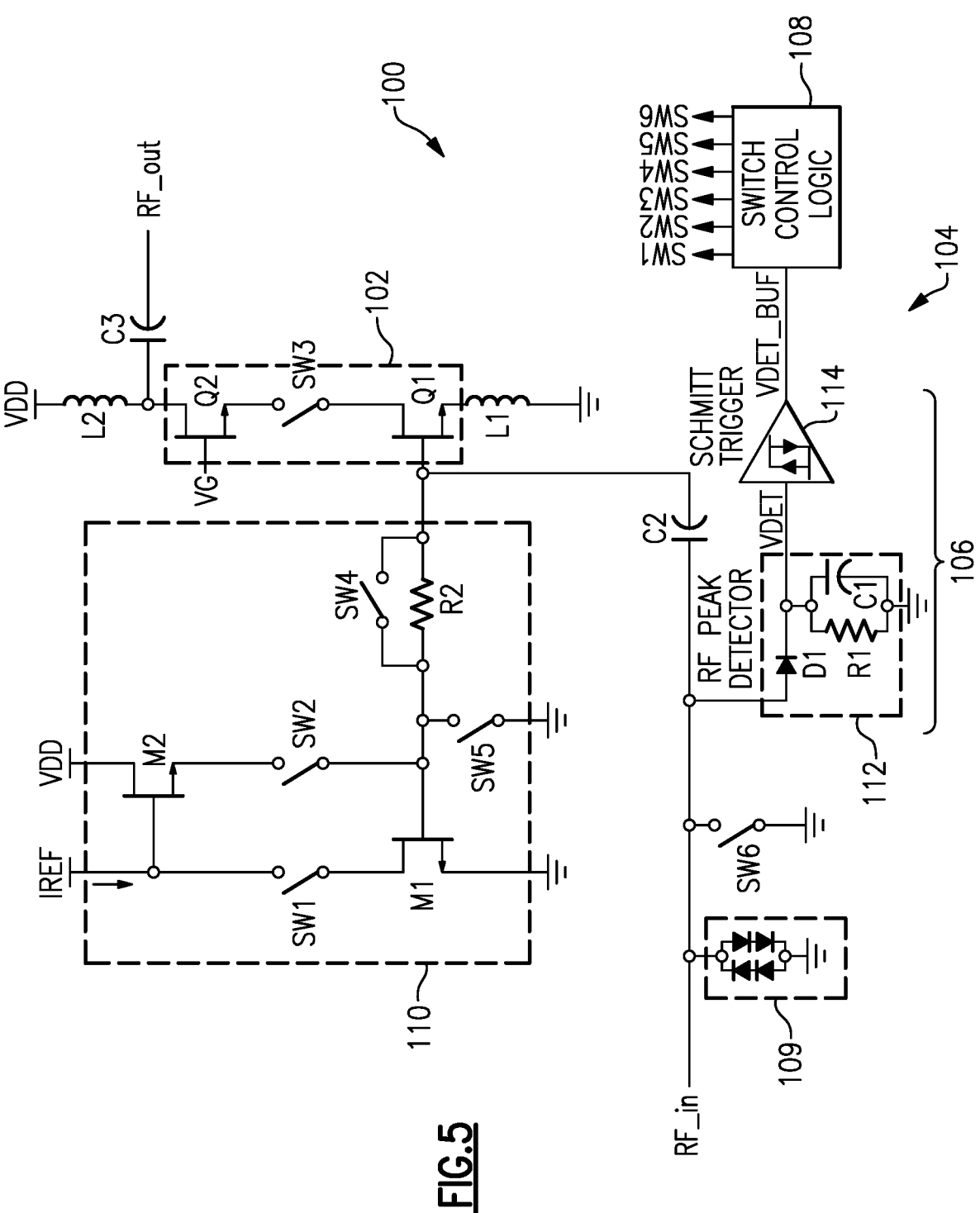
FIG. 5 shows an amplifier circuit that can be a more specific example of the amplifier circuit of FIG. 4A.

FIG. 5 shows an amplifier circuit 100 that can be a more specific example of the amplifier circuit of FIG. 4A. In the example of FIG. 5, an amplifier 102 is shown to include a cascode arrangement of first and second transistors Q1, Q2, similar to the example of FIG. 4A. An input signal (RF_in) is shown to be provided to a gate of Q1 through a DC-block capacitance C2, and an amplified signal is shown to be provided as an output (RF_out) through a drain of Q2 and a DC-block capacitance C3.

In the example of FIG. 5, a switch SW3 is shown to be provided between Q1 and Q2. More particularly, a drain of Q1 is shown to be coupled to a source of Q2 through the switch SW3. Examples related to operation of such a switch are described herein in greater detail.

In the example of FIG. 5, a bias circuit is generally indicated as 110, and is shown to include a current mirror where a reference current IREF can be replicated through a mirror arrangement of a transistor M1 on the IREF side and a transistor M2 on a supply (e.g., VDD) side. The mirrored current from the supply can be provided to the gate of Q1 of the amplifier 102 through a bias resistance R2 for operation of the amplifier 102.

In some embodiments, and as shown in FIG. 5, a number of switches can be provided for the bias circuit 110. For example, a switch SW1 is shown to be provided between the reference current source and the corresponding transistor M1; and similarly, a switch SW2 is shown to be provided between the transistor M2 and the bias resistance R2. A switchable bypass path having a switch SW4 is shown to be provided so as to be electrically parallel with the bias resistance R2. A switchable shunt path having a switch SW5 is shown to be provided between ground and a node between M2 and R2. Examples related to operations of such switches associated with the bias circuit 110 are described herein in greater detail.

Referring to the example of FIG. 5, a switchable shunt path having a switch SW6 can be provided between the input path and ground. Examples related to operation of such a switch are described herein in greater detail.

FIG. 5 shows that in some embodiments, a protection circuit 104 can include an RF peak detector 112 coupled to the input path. As described herein, such an RF peak detector can sample and measure a detected voltage VDET representative of a peak value of an RF signal at the input path. For example, a diode D1 can limit flow of current from the sampled RF signal to a forward direction as shown, and a capacitor C1 can be charged by the current to reach a peak voltage. A resistor R1 can be implemented to allow the charged capacitor to discharge.

In some embodiments, the detected voltage VDET from the RF peak detector 112 can be provided to a comparator 114. The comparator 114 can output a signal VDET_BUF (e.g., high or low) based on the value of the input signal VDET. For example, if the value of VDET is greater than a first threshold value, the output signal VDET_BUF can be set to be high, and based on such a high signal, a control action can be enabled to protect the amplifier circuit 100. If the value of VDET is less than a second threshold value, the output signal VDET_BUF can be set to be low, and based on such a low signal, the foregoing control action can be disabled to allow the amplifier circuit 100 to return to normal operation.

In some embodiments, the first threshold value and the second threshold value utilized by the comparator 114 can be different. In some embodiments, such different threshold values for low-to-high and high-to-low transitions of the output signal VDET_BUF can be provided by a Schmitt trigger implemented as the foregoing comparator 114. Such a Schmitt trigger can include a hysteresis property to provide such different threshold values. Examples of enabling and disabling of protection of the amplifier circuit 100 based on such hysteresis property are described herein in greater detail.

In the example of FIG. 5, the RF peak detector 112 and the Schmitt trigger 114 can be considered to be an example of the detector component 106 of FIG. 4A. In FIG. 5, a switch control logic circuit 108 can be considered to be an example of the control component 108 of FIG. 4A. In some embodiments, such a switch control logic circuit can provide a first set of switch control signals for the switches SW1, SW2, SW3, SW4, SW5, SW6 if the VDET_BUF from the Schmitt trigger 114 is high, and provide a second set of switch control signals for the same switches if the VDET_BUF from the Schmitt trigger 114 is low. Examples of such switching control functionality are described herein in greater detail.

In the example of FIG. 5, a diode-based ESD protection circuit 109 is shown to be coupled to the input path of the amplifier 102. It will be understood that an amplifier circuit having one or more features as described herein may or may not include such a diode-based ESD protection circuit. In some embodiments, since the protection circuit 104 can provide protection against high input power, the diode-based ESD protection circuit 109 can be configured appropriately so that it does not need to handle high input power. For example, diodes of the ESD protection circuit 109 can be configured as smaller multi-stack devices to meet lower power human body model (HBM)/charge device model (CDM) protection requirements, thereby resulting in reduced parasitic capacitance for the amplifier circuit 100.

Figure 6A:
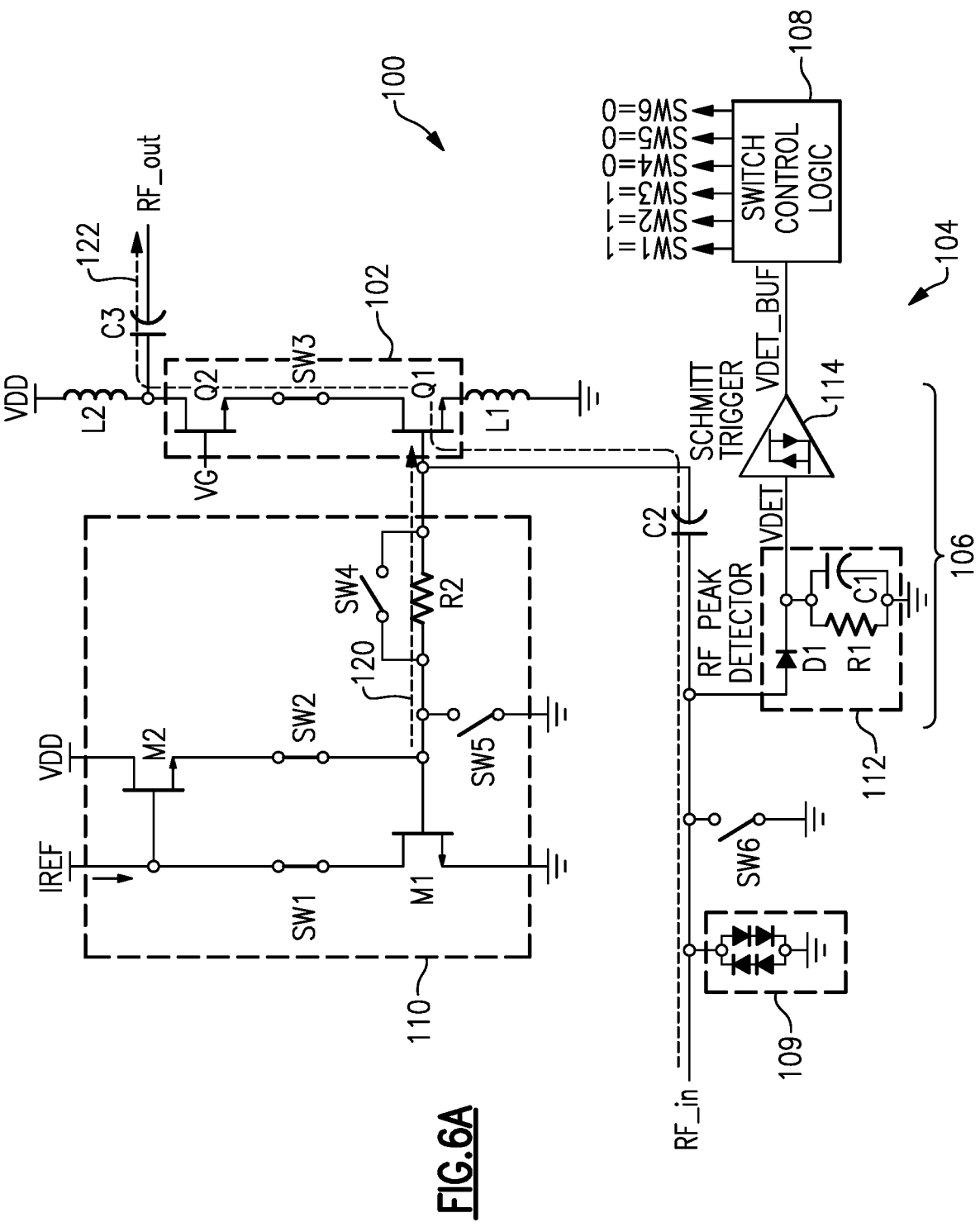
FIG. 6A shows the amplifier circuit of FIG. 5 where the protection circuit is configured for a normal operating mode.
Figure 6B:
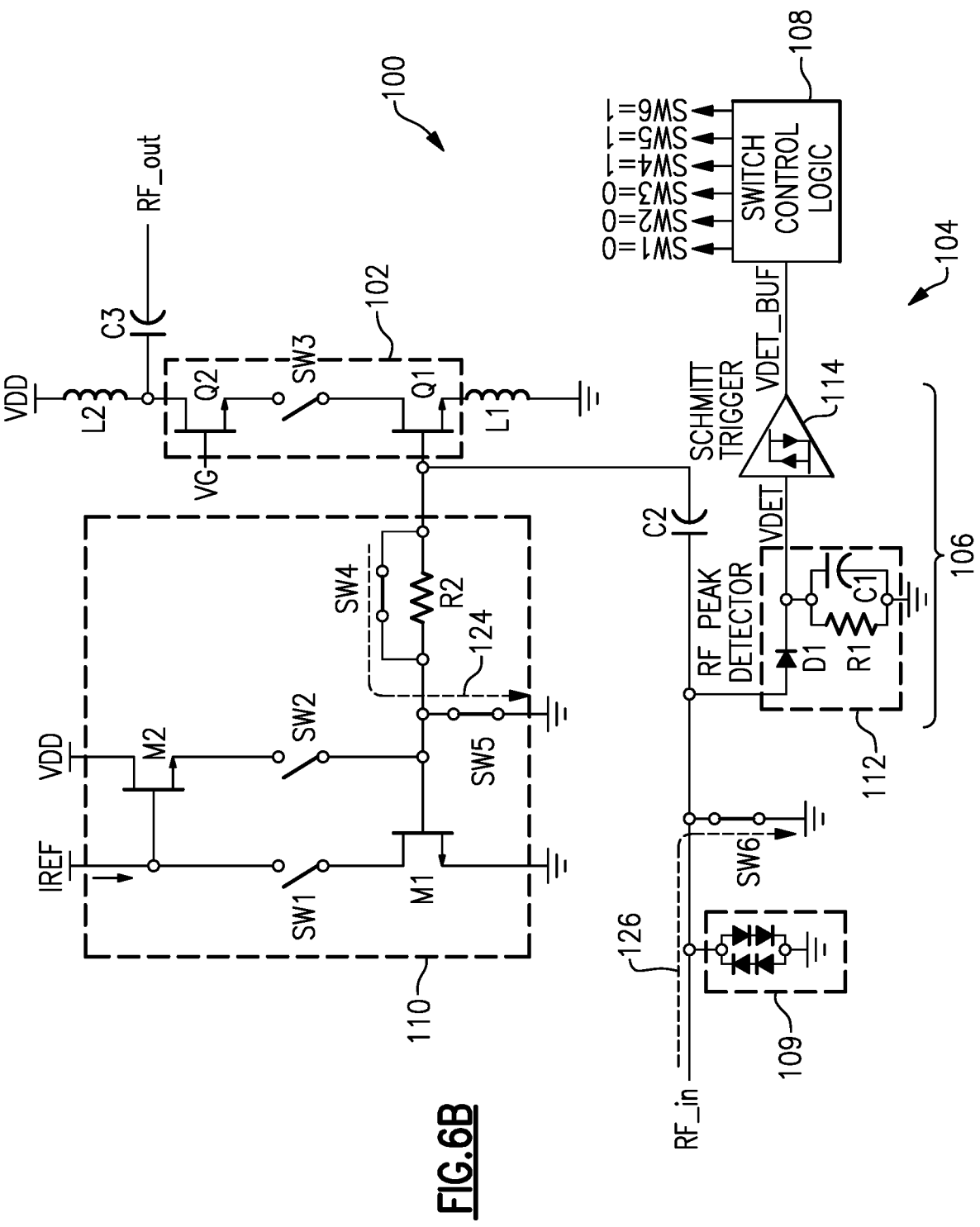
FIG. 6B shows the amplifier circuit of FIG. 5 where the protection circuit is configured for a protection mode upon detection of a high power condition at the input of the amplifier.

FIG. 6A shows the amplifier circuit 100 of FIG. 5 where the protection circuit 104 is configured for a normal operating mode, and FIG. 6B shows the same amplifier circuit 100 where the protection circuit 104 is configured for a protection mode upon detection of a high power condition at the input of the amplifier 102.

Referring to the normal operating mode of FIG. 6A, an RF signal is shown to be provided to Q1 as an input; Q1 is shown to provide a partially amplified signal to Q2; and Q2 is shown to provide an amplified signal as an output of the amplifier 102. In FIG. 6A, a path taken by the input signal (RF_in) to become the output signal (RF_out) is depicted as 122. To support such an amplification operation, the bias circuit 110 is shown to provide a bias signal to Q1, as depicted by arrow 120.

More particularly, it is noted that in the normal operating mode of FIG. 6A, each of the switches SW1 and SW2 of the bias circuit 110 can be closed to allow operation of the current mirror involving the transistors M1 and M2. Each of the switches SW4 and SW5 can be opened to allow the resulting bias signal to be delivered to Q1 through the bias resistance R2. With respect to the signal path 122 of FIG. 6A, the shunt switch SW6 can be opened to allow the input signal to be delivered to Q1, and the switch SW3 can be closed to allow the partially amplified signal to be delivered to Q2 from Q1.

Referring to the protection mode of FIG. 6B, an RF signal present at the input path can include, for example, a high power signal being transmitted from a nearby device. Accordingly, such an RF signal is shown to be shunted to ground through the shunt path, as indicated by arrow 126. Further, operation of the bias circuit 110 can be disabled, such that a bias signal is not delivered to Q1.

More particularly, it is noted that in the protection mode of FIG. 6B, each of the switches SW1 and SW2 of the bias circuit 110 can be opened to disable operation of the current mirror involving the transistors M1 and M2. Each of the switches SW4 and SW5 can be closed to allow shunting of any current to ground through the switch SW5. For example, arrow 124 depicts a shunt path that can allow a current from Q1 to be shunted to ground through the bypass switch SW4. With respect to the input signal path, the shunt switch SW6 can be closed to allow the RF signal (having high power) to be shunted to ground through the shunt switch S6. Since there is no inline switch along the input path to Q1, Q1 can be subjected to at least some of the RF signal; and at least some of the current associated with such RF signal at Q1 can be further shunted to ground through the foregoing bypass switch SW4 and the shunt switch SW5. Since the switch SW3 is now open, Q2 can be substantially isolated from Q1 (and thereby the RF signal present at Q1). The open state of Q2 also disables the amplifier current associated with the supply voltage (VDD).

Referring to FIGS. 6A and 6B, the foregoing normal operating mode and the protection mode can be controlled by the switch control logic circuit 108 providing appropriate switch control signals. For example, a given switch control signal can be a low signal or a low bit 0 to open the corresponding switch, or a high signal or a high bit 1 to close the corresponding switch. Table 1 lists combinations of switch states corresponding to the respective modes of FIGS. 6A and 6B.

TABLE 1

| Mode | SW1 | SW2 | SW3 | SW4 | SW5 | SW6 |
|---|---|---|---|---|---|---|
| Normal | Closed | Closed | Closed | Open | Open | Open |
| Protection | Open | Open | Open | Closed | Closed | Closed |

As described herein, a comparator such as the Schmitt trigger of FIG. 5 can be configured so that the protection mode is triggered for the amplifier circuit 100 when the detected peak voltage VDET exceeds a first threshold voltage Vlh (e.g., when VDET>Vlh), and the amplifier circuit 100 reverts back to the normal operating mode when VDET falls below a second threshold voltage Vhl (e.g., when VDET<Vhl). In some embodiments, the first threshold voltage Vlh can be greater than the second threshold voltage Vhl so as to, for example, prevent a chattering effect where the amplifier circuit 100 is too sensitive to transitions between the normal operating mode and the protection mode.

More particularly, suppose that the first and second threshold values are approximately the same, such that Vlh≈Vhl. In such a configuration, the amplifier circuit 100 can transition from normal mode to protection mode once the detected peak voltage VDET exceed Vlh (≈Vhl). After such a transition, there may be fluctuations in VDET about the common value of Vlh and Vhl. In such a situation, the amplifier circuit 100 can undergo rapid transitions, or chattering, between the normal and protection modes.

However, if the first threshold voltage Vlh (for triggering the protection mode) is greater than the second threshold voltage Vhl (for reverting back to the normal mode), the foregoing chattering effect can be eliminated or reduced.

Figures 7A, 7B:
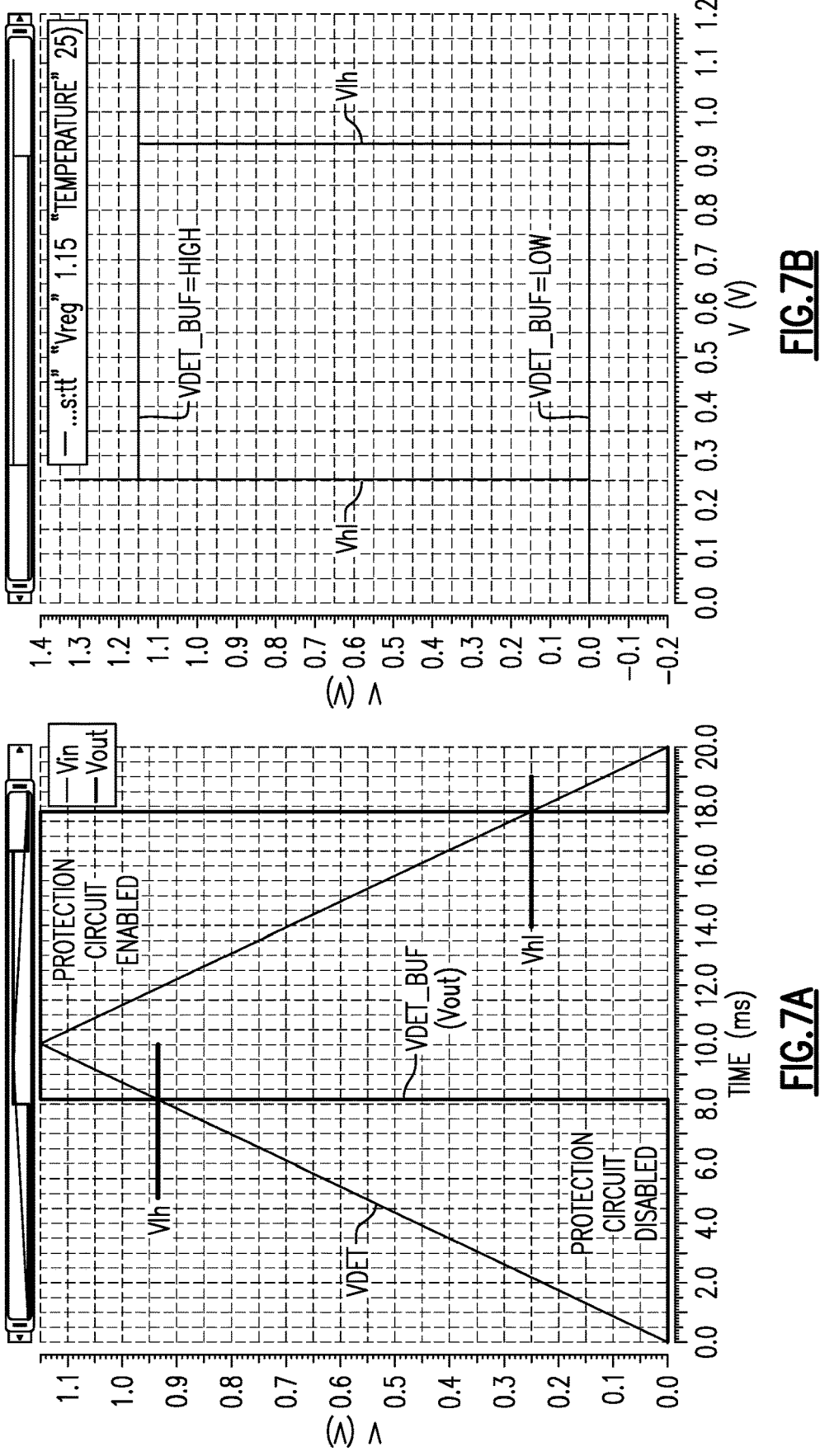
FIGS. 7A and 7B show an examples of transitions between a normal operating mode and a protection mode that can be implemented to reduce or eliminate undesirable effects such as a chattering effect.

FIGS. 7A and 7B show an example of how such a difference in Vlh and Vhl can allow the protection mode to be triggered and enabled without being subjected to rapid mode changes. Referring to FIG. 7A, suppose that a detected peak voltage VDET increases as a function of time. When VDET is less than the first threshold voltage Vlh, the value of VDET_BUF is shown to remain low, such that the protection configuration for the amplifier circuit (100 in FIG. 5) is disabled so as to have the amplifier circuit be in a normal operating mode (e.g., FIG. 6A). When VDET exceeds the first threshold voltage Vlh, the value of VDET_BUF is shown to change to high, such that the protection configuration for the amplifier circuit is enabled so as to have the amplifier circuit be in a protection mode (e.g., FIG. 6B).

Referring to FIG. 7A, suppose further that VDET reaches a maximum value, and then decreases as a function of time. When VDET falls below Vlh but remains higher than Vhl, the protection configuration for the amplifier circuit remains enabled. When VDET falls below Vhl, the value of VDET_BUF is shown to become low, such that the protection configuration for the amplifier circuit is disabled.

FIG. 7B depicts a plot of the threshold voltages Vlh, Vhl and VDET_BUT states, demonstrating the hysteresis property provided by the Schmitt trigger of FIG. 5. More particularly, VDET_BUF is shown to transition from LOW to HIGH at the Vlh threshold, and to transition from HIGH to LOW at the Vhl threshold that is lower than Vlh, thereby resulting in a zone between Vhl and Vlh. Such a zone can be configured appropriately to prevent or reduce rapid switching between modes.

Figure 8A:
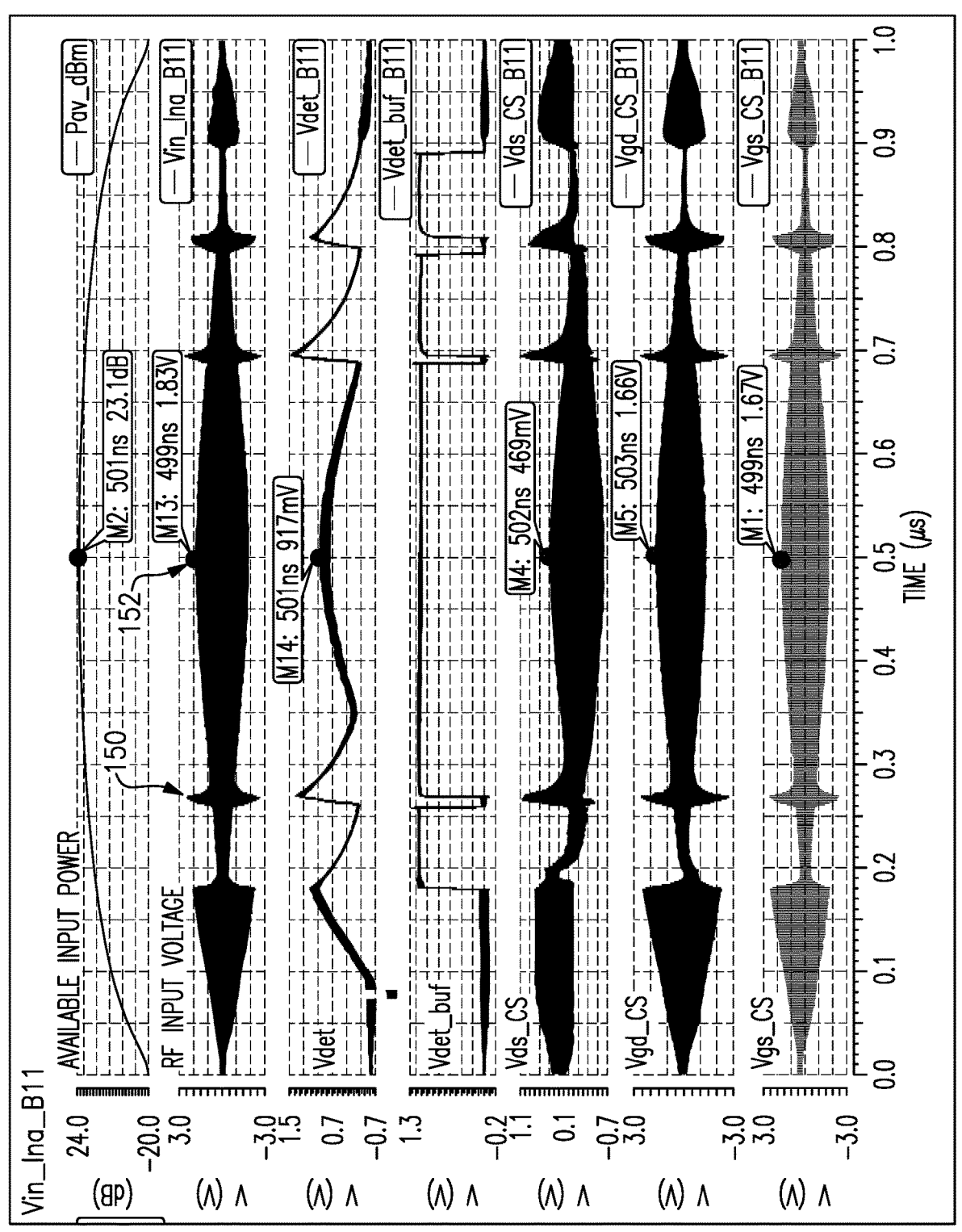
FIG. 8A shows various signal traces associated with the common source transistor (Q1) of the amplifier circuit of FIG. 5.
Figure 8B:
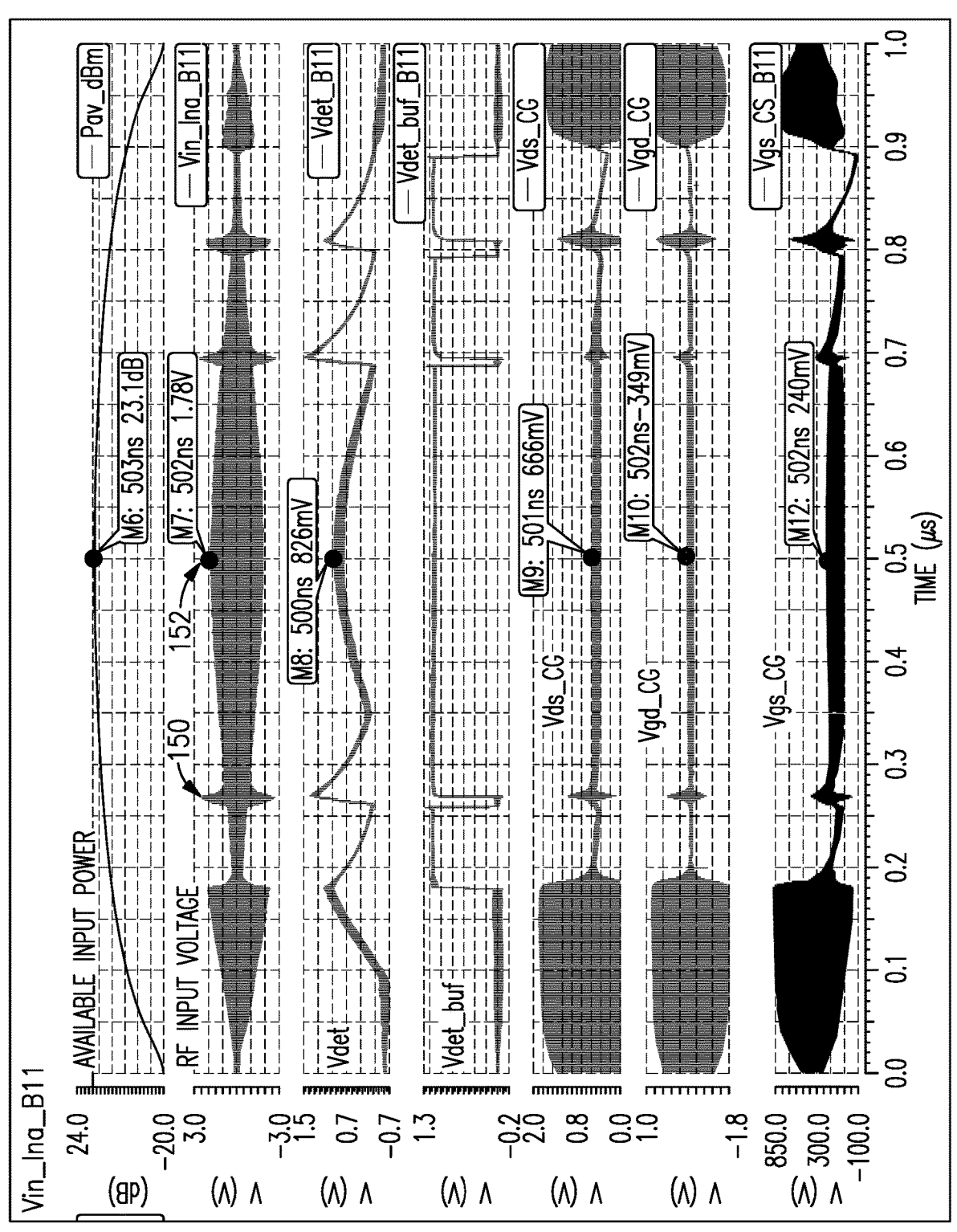
FIG. 8B shows various signal traces associated with the common gate transistor (Q2) of the amplifier circuit of FIG. 5.
Figure 8C:
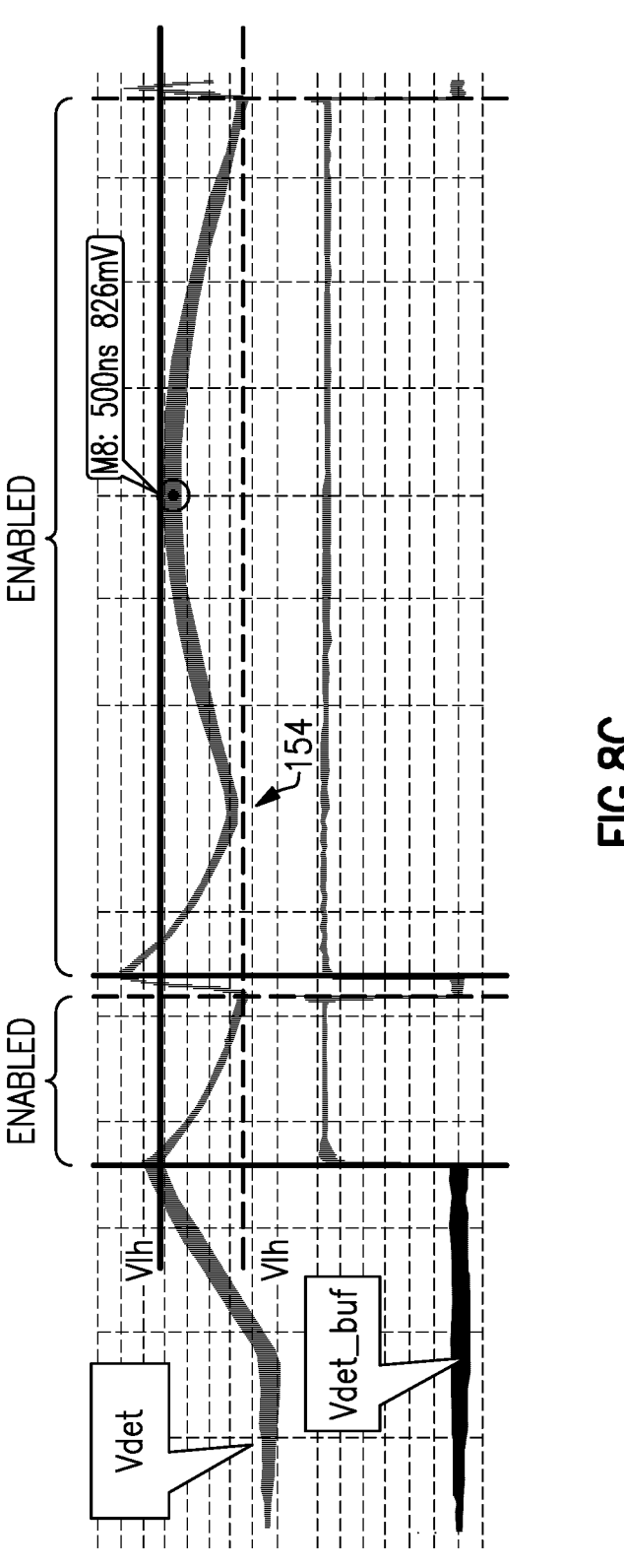
FIG. 8C shows an enlarged view of portions of selected traces of FIGS. 8A and 8B.

FIG. 8A shows various signal traces associated with the common source transistor (Q1) of the amplifier circuit of FIG. 5. Such traces are voltage trace of an input signal (RF_in in FIG. 5, and indicated as "RF input voltage" in FIG. 8A), detected peak voltage (Vdet), output of the Schmitt trigger (Vdet_buf), drain-source voltage of Q1 (Vds_CS), gate-drain voltage of Q1 (Vgd_CS), and gate-source voltage of Q1 (Vgs_CS). FIG. 8B shows various signal traces associated with the common gate transistor (Q2) of the amplifier circuit of FIG. 5. Such traces are voltage trace of an input signal (RF_in in FIG. 5, and indicated as "RF input voltage" in FIG. 8B), detected peak voltage (Vdet), output of the Schmitt trigger (Vdet_buf), drain-source voltage of Q2 (Vds_CG), gate-drain voltage of Q2 (Vgd_CG), and gate-source voltage of Q2 (Vgs_CG). It is noted that the traces "RF input voltage," "Vdet" and "Vdet_buf" are same traces in FIGS. 8A and 8B. FIG. 8C shows an enlarged view of portions of the "Vdet" and "Vdet_buf" traces of FIGS. 8A and 8B.

Referring to FIGS. 8A-8C, and more particularly to the beginning portion of the traces where RF input voltage begins to increase in its amplitude, one can see that the detected peak voltage (Vdet) remains at approximately zero until the Vdet exceeds D1's forward turn-on voltage. Vdet is then shown to increase in proportion to the increase in the RF input voltage, until it exceeds the first threshold value (Vlh in FIG. 8C), thereby resulting in the Schmitt trigger to generate a high output (Vdet_buf=high) and enabling the protection mode.

The RF input voltage is shown to decrease rapidly soon after the foregoing transition to the protection mode, and the protection mode remains enabled even though the detected peak voltage Vdet decreases to a level below the first threshold value (Vlh). Vdet is shown to follow the decreasing trend of the RF input voltage, but at a slower rate, and eventually reach a level below the second threshold value (Vhl), thereby resulting in the Schmitt trigger to generate a low output (Vdet_buf=low) and disabling the protection mode.

The RF input voltage is shown to increase rapidly soon after the foregoing transition to the normal operating mode, and the protection mode is enabled rapidly based on the detected peak voltage Vdet rapidly increasing beyond the first threshold value (Vlh).

The foregoing rapidly increasing RF input voltage is shown to reach a peak (150 in FIGS. 8A and 8B), decrease rapidly to a level, increase slowly to another peak level (152 in FIGS. 8A and 8B), and then decrease slowly. The corresponding Vdet is shown to follow the foregoing trend of the RF input voltage, including the slower-rate decrease corresponding to the rapid decrease of the RF input voltage from the peak 150. Vdet is shown to reach a level (154 in FIG. 8C) that is close to but still above the second threshold value Vhl, such that the protection mode remains enabled.

Base on the foregoing example traces of the RF input voltage and the detected peak voltage (Vdet), one can see that in some embodiments, a protection circuit having one or more features as described herein can be configured so that a transition from normal operating mode to protection mode can be achieved rapidly (e.g., similar to the rate of increase of the RF input voltage), and so that a transition from protection mode to normal operating mode can be achieved at a slower rate to reduce the likelihood of the protection mode being disabled too quickly. As described herein, such a delayed disabling of the protection mode can be achieved by the hysteresis property of the Schmitt trigger, by the slower rate of response of the detected peak voltage (Vdet), or some combination thereof.

Referring to FIG. 8A, and as described herein in reference to FIG. 6B, one can see that the common source transistor (Q1) is subjected to the RF input voltage during the protection-enabled periods. However, and as shown in FIG. 8B and described herein in reference to FIG. 6B, one can see that the common gate transistor (Q2) is substantially isolated from the RF input voltage during the protection-enabled periods, such that various voltages associated with Q2 have zero or very low amplitudes.

In the various examples described herein in reference to FIGS. 1, 2 and 4-8, it is assumed that a protection circuit having one or more features as described herein is implemented on the input side of a corresponding amplifier. However, it will be understood that one or more features of the present disclosure can also be implemented on each of either or both of the input side and the output side of an amplifier.

In some embodiments, the input side of an amplifier can be an antenna side for receiving a signal from an antenna. In such an example configuration, the amplifier can be, for example, an LNA.

Figures 9, 10:
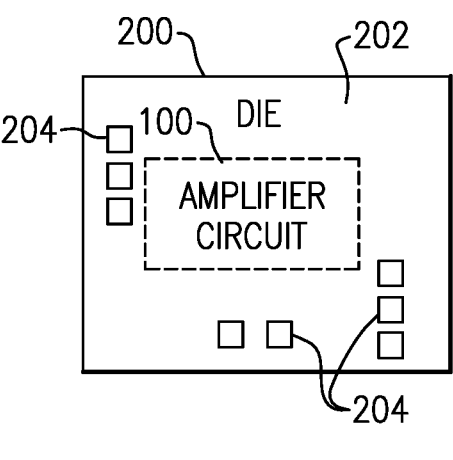
FIG. 9 shows that in some embodiments, substantially all of a protection circuit having one or more features as described herein can be implemented on a die that includes the corresponding amplifier.
FIG. 10 shows that in some implementations, one or more features described herein can be included in a module.

FIG. 9 shows that in some embodiments, substantially all of a protection circuit having one or more features as described herein can be implemented on a die that includes the corresponding amplifier. Thus, in FIG. 9, a die 200 is shown to include an amplifier circuit 100 having an amplifier and a protection circuit as described herein. Such an amplifier circuit can be implemented on a semiconductor substrate 202, and various connections for operations of the die 200 can be supported by, for example, contact pads 204.

In some embodiments, the die 200 of FIG. 9 can be configured to support formation and operation of FET devices or FET-based devices. For example, transistors Q1, Q2, M1, M2, various switches, diode D1, and transistors associated with the Schmitt trigger can be implemented as MOSFET devices or MOSFET-based devices. In some embodiments, such MOSFET devices can be NMOS devices.

As described herein, various switches can be operated to allow the amplifier circuit to be in a normal operating mode or a protection mode. As also described herein, use of a comparator having a hysteresis property, such as a Schmitt trigger, provides a "dead zone" where the protection mode remains enabled to prevent a chattering effect. In some embodiments, some or all of the foregoing switches can be configured to support such a dead zone. For example, switches SW4, SW5 and SW6 that are open during the normal operating mode and closed during the protection mode can be sized appropriately such that the detected peak voltage VDET resides in the Schmitt trigger's dead zone, thereby preventing the protection mode being prematurely disabled.

In some embodiments, other non-transistor elements of the amplifier circuit can also be implemented to be parts of the die 200. For example, various resistances, inductances and capacitances can be implemented utilizing respective on-die technologies.

It is noted that in the context of the amplifier circuit being a receive amplifier circuit (e.g., with an LNA), a protection circuit as described herein can be configured to support various frequency ranges, including LNAs operating at MB/HB/UHB frequencies. As described herein, such a protection circuit disables LNA current during the protection mode, and such a feature prevents die metallization from overheating and possibly melting.

It is also noted that a protection circuit as described herein consumes little or no current, and requires a relatively small amount of additional die area. For example, the peak detector and Schmitt trigger (e.g., 112, 114 in FIG. 5) can be implemented in an area of about 630 $\mu m^2$ utilizing, for example, CMOS technologies.

In some embodiments, an amplifier circuit as described herein can be configured to support higher frequency applications (e.g., >5 GHZ, millimeter waves). For example, an LNA can utilize CMOS processes with smaller gate lengths and thinner gate oxides. Such a configuration can result in, for example, time-dependent dielectric breakdown (TDDB) gate voltages, thereby potentially reducing the maximum lifetime of the LNA device. In some embodiments, a protection circuit as described herein can accommodate these lower clamp levels without sacrificing the performance of the LNA.

In some implementations, one or more features described herein can be included in a module. FIG. 10 depicts an example module 300 having a packaging substrate 302 that is configured to receive a plurality of components. In some embodiments, such components can include a die 200 having one or more features as described herein. For example, the die 200 can include an amplifier circuit 100 that includes a protection circuit as described herein. A plurality of connection pads 304 can facilitate electrical connections such as wirebonds 308 to connection pads 310 on the substrate 302 to facilitate passing of various power and signals to and from the die 200.

In some embodiments, other components can be mounted on or formed on the packaging substrate 302. For example, one or more surface mount devices (SMDs) (314) can be implemented. In some embodiments, the packaging substrate 302 can include a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figures 11, 12:
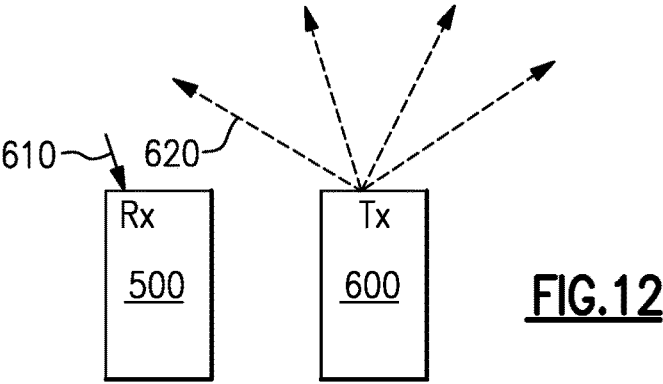
FIG. 11 depicts an example wireless device having one or more advantageous features described herein.
FIG. 12 shows an example where the wireless device of FIG. 11 can benefit with a protection circuit having one or more features as described herein.

FIG. 11 depicts an example wireless device 500 having one or more advantageous features described herein. In some embodiments, a module having one or more features as described herein can be implemented as, for example, a diversity receive module 300 in close proximity to a diversity antenna 530, or a module configured to receive a signal from any antenna. Such a module can be configured to provide one or more desirable features as described herein.

In the example of FIG. 11, power amplifiers (PAs) in a PA module 512 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500.

Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example of FIG. 11, the DRx module 300 can be implemented between one or more diversity antennas (e.g., diversity antenna 530) and the ASM 514. Such a configuration can allow an RF signal received through the diversity antenna 530 to be processed with little or no loss of and/or little or no addition of noise to the RF signal from the diversity antenna 530. Such processed signal from the DRx module 300 can then be routed to the ASM through one or more signal paths.

In the example of FIG. 11, a main antenna 520 can be configured to, for example, facilitate transmission of RF signals from the PA module 512. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, in some embodiments, an amplifier circuit with a protection circuit can be configured for receive operations. As also described herein, such a protection circuit can prevent damage to the amplifier circuit in situations where a strong signal is received and presented to the amplifier circuit.

FIG. 12 shows an example where the wireless device 500 of FIG. 11 can benefit with the protection circuit (e.g., implemented as part of the receiver module 300). In FIG. 12, a wireless device 500 having such a protection circuit is shown to be receiving an incoming signal 610 (e.g., from a cell tower). In close proximity to the wireless device 500 is another wireless device 600 (that may or may not include a protection circuit) in a transmit operation, thereby transmitting a relatively powerful signal 620. Such a powerful signal can be picked up by the antenna of the wireless device 500 and be presented to its amplifier circuit. As described herein, a protection circuit associated with the amplifier circuit of the device 500 can be operated to protect the amplifier circuit.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. An amplifier circuit comprising:
an amplifier;
a bias circuit configured to provide a bias signal to the amplifier; and
a protection circuit configured to generate a detected signal representative of a power of a radio-frequency signal provided to the amplifier, the protection circuit further configured to enable a protection mode when the detected signal is greater than a first threshold value and to disable the protection mode when the detected signal is less than a second threshold value that is different from the first threshold value, the protection circuit including an assembly of one or more switches configured to implement the enablement and disablement of the protection mode.

2. A method for operating an amplifier, the method comprising:
providing a bias signal to an amplifier;
generating a detected signal representative of a power of a radio-frequency signal provided to the amplifier; and
enabling a protection mode when the detected signal is greater than a first threshold value and disabling the protection mode when the detected signal is less than a second threshold value that is different from the first threshold value, the enabling and disabling including operating one or more switches to provide the enablement and disablement of the protection mode.

* * * * *